(12) United States Patent
Vorenkamp et al.

(10) Patent No.: US 7,501,847 B2
(45) Date of Patent: Mar. 10, 2009

(54) INCREASED YIELD MANUFACTURING FOR INTEGRATED CIRCUITS

(75) Inventors: Pieter Vorenkamp, Laguna Niguel, CA (US); Neil Y. Kim, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 75 days.

(21) Appl. No.: 11/766,527

(22) Filed: Jun. 21, 2007

(65) Prior Publication Data

US 2007/0244662 A1 Oct. 18, 2007

Related U.S. Application Data

(63) Continuation of application No. 11/166,328, filed on Jun. 24, 2005, now Pat. No. 7,262,625.

(60) Provisional application No. 60/584,988, filed on Jul. 1, 2004.

(51) Int. Cl.
 *G01R 31/26* (2006.01)
(52) U.S. Cl. .................. 324/765; 324/73.1; 438/17
(58) Field of Classification Search ............ None
 See application file for complete search history.

(56) References Cited

U.S. PATENT DOCUMENTS

| | | | |
|---|---|---|---|
| 5,541,547 A | | 7/1996 | Lam |
| 6,198,261 B1 | | 3/2001 | Schultz et al. |
| 6,714,032 B1 | * | 3/2004 | Reynick ............ 324/765 |
| 7,023,230 B1 | | 4/2006 | Allen et al. |
| 2004/0082086 A1 | | 4/2004 | Arabi et al. |
| 2005/0188230 A1 | | 8/2005 | Bilak |

* cited by examiner

*Primary Examiner*—Minh N Tang
(74) *Attorney, Agent, or Firm*—McAndrews, Held & Malloy, Ltd.

(57) ABSTRACT

A system and method for providing increased manufacturing yield for integrated circuits. Various aspects of the invention may comprise receiving an integrated circuit designed to operate at nominal power supply characteristics. The integrated circuit may, for example, be tested at nominal power supply characteristics to determine if the integrated circuit meets performance requirements at nominal power supply characteristics. If the integrated circuit meets performance requirements at nominal power supply characteristics, then the integrated circuit may designated as such and further processed accordingly. Such a designation may, for example be visible, electronic or procedural. Various aspects of the present invention may also comprise testing the integrated circuit at non-nominal power supply characteristics to determine if the integrated circuit meets performance requirements at non-nominal power supply characteristics. If the integrated circuit meets performance requirements at non-nominal power supply characteristics, then the integrated circuit may be designated as such and further processed accordingly.

38 Claims, 3 Drawing Sheets

INCREASED YIELD MANUFACTURING FOR INTEGRATED CIRCUITS

CROSS-REFERENCE TO RELATED APPLICATIONS/INCORPORATION BY REFERENCE

This patent application is a CONTINUATION of U.S. application Ser. No. 11/166,328, filed Jun. 24, 2005, now U.S. Pat. No. 7,262,625 which is related to and claims priority from provisional patent application Ser. No. 60/584,988, filed Jul. 1, 2004, and entitled "INCREASED YIELD MANUFACTURING FOR INTEGRATED CIRCUITS," the contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Integrated circuits are typically designed to operate under nominal power supply characteristics. For example and without limitation, an integrated circuit may be designed to operate at a particular level of performance when powered at a nominal voltage level or over a nominal voltage range.

Integrated circuit manufacturing may produce integrated circuits of the same design having varying levels of performance. Such performance variability may, for example, be caused by any of a number of sources of manufacturing process variability (e.g., automated process variability and/or human variability) or material variability. Manufactured integrated circuits are often tested by applying electrical power that is characterized by nominal power supply characteristics and determining whether the tested integrated circuits perform at or above a minimum acceptable performance level. Manufactured integrated circuits that fail such a test are often discarded, resulting in monetary loss for the designer and/or manufacturer.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Various aspects of the present invention provide a system and method for providing increased manufacturing yield for integrated circuits, substantially as shown in and/or described in connection with at least one of the figures, as set forth more completely in the claims. These and other advantages, aspects and novel features of the present invention, as well as details of illustrative aspects thereof, will be more fully understood from the following description and drawings.

DETAILED DESCRIPTION OF THE INVENTION

Figure 1:
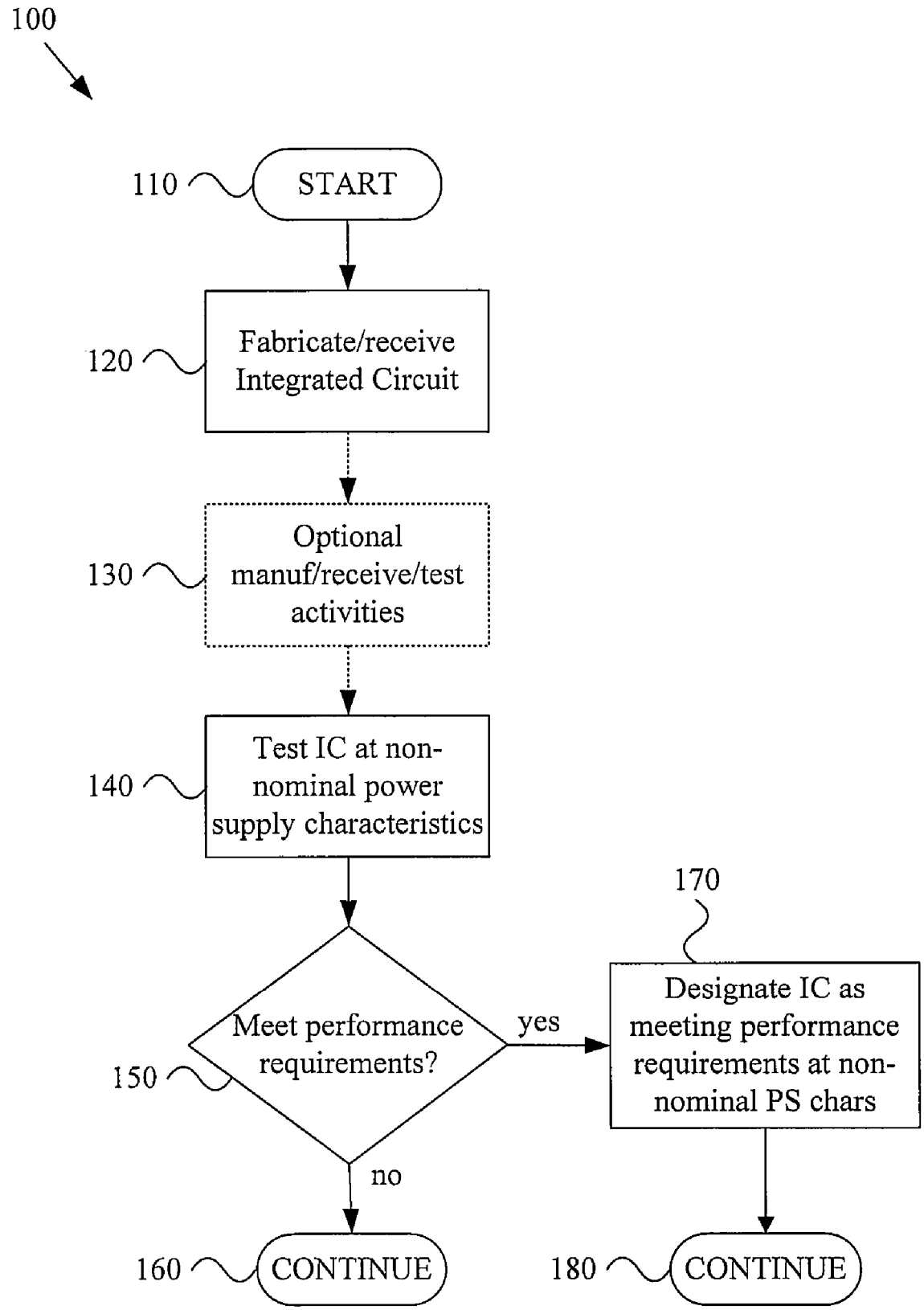
FIG. 1 illustrates an exemplary method for providing increased manufacturing yield for integrated circuits, in accordance with various aspects of the present invention.

FIG. 1 illustrates an exemplary method 100 for providing increased manufacturing yield for integrated circuits, in accordance with various aspects of the present invention. The exemplary method 100 may begin at step 110. The method 100 may begin for any of a variety of reasons. For example and without limitation, the method 100 may begin in response to a user or system command to begin. The method 100 may, for example, begin in response to pending arrival or production of one or more integrated circuits. The method 100 may, for example, begin in response to an electronic order for one or more of the integrated circuits. In general, the method 100 may begin in response to any of a variety of causes or conditions. Accordingly, the scope of various aspects of the present invention should not be limited by characteristics of any particular initiating cause or condition.

The exemplary method 100 may, at step 120, comprise receiving an integrated circuit. Step 120 may, for example and without limitation, comprise receiving a shipment of the integrated circuit(s) from another facility (e.g., an external chip supplier or internal off-site production site). Also for example, such receiving may comprise receiving the integrated circuit(s) from a local upstream integrated circuit fabrication line. Such receiving may, for example, comprise receiving the integrated circuit(s) in a batch or in series on a conveyor. In general, step 120 may comprise receiving an integrated circuit. Accordingly, the scope of various aspects of the present invention should not be limited by characteristics of a specific manner of receiving an integrated circuit.

The integrated circuit may comprise characteristics of any of a large variety of integrated circuits. For example and without limitation, the integrated circuit may comprise characteristics of a microprocessor circuit, signal processing circuit, user interface circuit, communication circuit, power supply circuit, audio/video circuit, analog circuit, digital circuit, etc.

In a non-limiting exemplary scenario, the integrated circuit may be adapted to operate with a variable power supply circuit, though such adaptation is by no means necessary. For example, the integrated circuit may comprise circuitry specifically adapted to communicate information with variable power supply circuitry. In another non-limiting exemplary scenario, the integrated circuit may be adapted to monitor its own performance and communicate information related to such monitored performance to other circuitry (e.g., variable power supply circuitry). In yet another non-limiting exemplary scenario, the integrated circuit may be adapted to operate with power supply circuitry that adjusts power supply characteristics to modify or optimize integrated circuit performance.

In general, the integrated circuit may comprise any of a large variety of integrated circuit characteristics. Accordingly, the scope of various aspects of the present invention should not be limited by characteristics of a particular integrated circuit.

Integrated circuits are generally designed to operate at planned (or nominal) power supply characteristics. Such nominal power supply characteristics may comprise specific target values or ranges. Such nominal power supply characteristics may, for example and without limitation, comprise voltage characteristics, such as voltage level and voltage variability (e.g., tolerance limits, noise limits, ripple characteristics, statistical variance, load response, etc.). Such nominal power supply characteristics may also, for example, comprise current characteristics, such as current level and current variability (e.g., tolerance limits, spike or surge characteristics, load response, etc.). Such nominal power supply characteristics may further, for example, comprise various energy or power characteristics.

For example and without limitation, an integrated circuit may be designed to meet performance requirements at a nominal voltage of 1.2 Volts or over a nominal voltage range of 5.0 Volts+/−10%. Also for example, an integrated circuit may be designed to meet performance requirements at an operating current of 1.0 Amperes or over an operating current range of 0.5 Amperes+/−5%. Further for example, an integrated circuit may be designed to meet performance requirements when provided with electrical power having less than a 10% noise component. Still further for example, an integrated circuit may be designed to meet performance requirements, even when subjected to loss of voltage or a substantial voltage drop of no more than a maximum duration.

In general, integrated circuits may be generally designed to meet performance requirements when provided with electrical power characterized by nominal power supply characteristics. Accordingly, the scope of various aspects of the present invention should not be limited by aspects of one or more particular nominal power supply characteristics.

Compared to the nominal (or planned) power supply characteristics, non-nominal power supply characteristics may generally be considered to be different than the nominal power supply characteristics discussed above. Note that a non-nominal range may overlap with a nominal range. That is, the difference between nominal power supply characteristics and non-nominal power supply characteristics may be determined by different single values and/or different range limits, depending on the particular power supply characteristic being compared.

In an exemplary scenario, nominal power supply characteristics may comprise a voltage range of 2.0V+/−0.2V, where any voltage less than 1.8V and more than 2.2V is non-nominal. Also in the exemplary scenario, a tighter voltage tolerance range of +/−0.1V may also be considered non-nominal (e.g., by imposing a tighter tolerance range than the nominal tolerance range).

In another exemplary scenario, nominal power supply characteristics may comprise a maximum voltage variability of +/−10% from a target voltage, where a voltage different than the target voltage by more than 10% is non-nominal (e.g., by being out of the nominal range). Also in the exemplary scenario, a more restrictive voltage variability range of +/−5% from the target voltage may represent a non-nominal range.

In yet another exemplary scenario, nominal power supply characteristics may comprise a maximum amount of noise of +/−20% of the power supply voltage level, where an amount of noise different by more than 20% than the power supply voltage level is non-nominal. Also in the exemplary scenario, more restrictive noise limits of +/−5% may represent a non-nominal range.

In general, compared to the nominal (or planned) power supply characteristics, non-nominal power supply characteristics may generally be considered to be different (e.g., in value or in range, depending on the characteristic) than the nominal power supply characteristics discussed above. Accordingly, the scope of various aspects of the present invention should not be limited by characteristics of a particular difference between nominal and non-nominal power supply characteristics.

As mentioned previously, in general, integrated circuits may be generally designed to meet performance requirements under particular operating conditions. Such performance requirements may comprise characteristics of any of a variety of performance metrics. For example and without limitation, performance may be measured by processing speed of the integrated circuit. Also for example, performance may be measured by operating temperature or energy efficiency of the integrated circuit. Further for example, performance may be measured by performance of the integrated circuit in response to any of a variety of disturbance conditions (e.g., load, noise, various environmental conditions, etc.). Accordingly, the scope of various aspects of the present invention should not be limited by characteristics of any particular integrated circuit performance metric.

The exemplary method 100 may, at step 130, comprise optionally performing any of a variety of manufacturing activities on the integrated circuit received at step 120. Such manufacturing activities may, for example and without limitation, comprise various receiving activities (e.g., inventorying, inspecting, accounting, etc.), various material-handling activities (e.g., routing, re-packing, transporting, etc.), and various other manufacturing activities (e.g., in-circuit and out-of-circuit testing, statistical sampling, product marking, mounting the integrated circuit to a printed wire board or multi-chip module, incorporating the integrated circuit into a product, etc.). In a non-limiting exemplary scenario, step 130 may comprise testing the integrated circuit at nominal power supply characteristics to determine if the integrated circuit meets performance requirements at nominal power supply characteristics. An example of this non-limiting exemplary scenario will be discussed in more detail later in the discussion of FIG. 2.

In general, step 130 may comprise optionally performing any of a variety of manufacturing activities on the integrated circuit. Accordingly, the scope of various aspects of the present invention should not be limited by additional actions that may be performed on the integrated circuit received at step 120.

The exemplary method 100 may, at step 140, comprise testing the integrated circuit at non-nominal power supply characteristics to determine if the integrated circuit meets performance requirements at non-nominal power supply characteristics. Various aspects of non-nominal power supply characteristics were discussed previously. Various aspects of integrated circuit performance requirements were also discussed previously. Exemplary step 140 generally comprises testing the integrated circuit at such non-nominal power supply characteristics to determine if the integrated circuit meets such performance requirements at such non-nominal power supply characteristics.

For example, in an exemplary scenario where the nominal power supply characteristics comprise a nominal voltage range, step 140 may comprise testing the integrated circuit at a non-nominal voltage outside of the nominal voltage range.

In another exemplary scenario where the nominal power supply characteristics comprise a nominal target voltage with a nominal tolerance range, step 140 may comprise testing the integrated circuit over a non-nominal tolerance range that is smaller than the nominal tolerance range.

In a further exemplary scenario where the nominal power supply characteristics comprise a minimum current supply level, step 140 may comprise testing the integrated circuit at a non-nominal current supply level that is less than the nominal minimum current supply level. In yet another exemplary scenario where the nominal power supply characteristics comprise a maximum amount of electrical noise, step 140 may comprise testing the integrated circuit with a non-nominal maximum amount of electrical noise that is less than the nominal maximum amount of electrical noise.

In another exemplary scenario where the nominal power supply characteristics comprise a maximum duration of a temporary voltage drop, step 140 may comprise testing the integrated circuit with a non-nominal maximum voltage drop duration that is less than the nominal maximum duration. In yet another exemplary scenario where the nominal power supply characteristics comprise a maximum duration of a temporary current supply drop, step 140 may comprise testing the integrated circuit with a non-nominal maximum current supply drop duration that is less than the nominal maximum duration.

Step 140 may perform such integrated circuit testing in any of a variety of manners. For example and without limitation, step 140 may comprise testing performance of the integrated circuit in a test circuit. Also for example, step 140 may comprise testing performance of the integrated circuit as a stand-alone device. Step 140 may comprise utilizing various commercially available testing apparatus or may comprise utilizing custom testing apparatus. Step 140 may, for example, comprise testing the integrated circuit on testing apparatus dedicated to such a test or may, for example, comprise testing the integrated circuit on testing apparatus that is also utilized for other testing of the integrated circuit or other circuits.

Step 140 may, for example, comprise applying electrical power having non-nominal power supply characteristics to the integrated circuit and monitoring any of a variety of performance indicators. Step 140 may, for example, process monitored performance indicators to determine whether the integrated circuit meets performance requirements when operated at non-nominal power supply characteristics.

In general, exemplary step 140 may comprise testing the integrated circuit at non-nominal power supply characteristics to determine if the integrated circuit meets performance requirements at non-nominal power supply characteristics. Accordingly, the scope of various aspects of the present invention should not be limited by aspects of particular non-nominal power supply characteristics or by characteristics of any particular manner of testing the integrated circuit at such non-nominal power supply characteristics.

The exemplary method 100 may, at step 150, comprise controlling execution flow of the exemplary method 100. Step 150 may, for example, comprise analyzing the results of the integrated circuit testing performed at step 140 and directing execution flow of the exemplary method 100 according to whether the exemplary circuit met performance requirements at non-nominal power supply characteristics. For example, if step 140 tested the integrated circuit at non-nominal power supply characteristics and found that the integrated circuit did not meet performance requirements at the non-nominal power supply characteristics, then step 150 may comprise directing execution flow to step 160. Also for example, if step 140 tested the integrated circuit at non-nominal power supply characteristics and found that the integrated circuit met performance requirements at non-nominal power supply characteristics, then step 150 may comprise directing execution flow to step 170.

The exemplary method 100 may, at step 160, comprise performing continued processing of the integrated circuit, which steps 140 and 150 determined failed to meet performance requirements at non-nominal power supply characteristics. Such continued processing may comprise any of a variety of types of further processing that may be performed on an integrated circuit that fails a performance test. For example, step 160 may comprise performing additional testing of the integrated circuit.

Step 160 may, for example, comprise routing the integrated circuit to a manufacturing station that processes such failing integrated circuits. Step 160 may, for example, comprise performing additional performance testing (e.g., testing to less stringent performance requirements). Step 160 may, for example, comprise performing failure analysis on the integrated circuit to determine why the integrated circuit did not pass previous testing. Also for example, step 160 may comprise scrapping the integrated circuit. In general, step 160 may comprise performing continued processing of the integrated circuit. Accordingly, the scope of various aspects of the present invention should not be limited by characteristics of any particular continued processing.

The exemplary method 100 may, at step 170, comprise designating the integrated circuit as meeting the performance requirements at non-nominal power supply characteristics. Such a designation may also, for example, in a scenario where operating characteristics of one or more particular power supply circuits are known, comprise information as to which power supply circuit(s) may provide power to the integrated circuit at the non-nominal power supply characteristics.

Step 170 may comprise performing such designating in any of a variety of manners. For example and without limitation, step 170 may comprise designating the integrated circuit as meeting the performance requirements (or not) at non-nominal power supply characteristics by physically marking the integrated circuit with a detectable indicium indicative of the integrated circuit meeting the performance requirements at non-nominal power supply characteristics. Such a detectable indicium may, for example, comprise a visibly detectable indicium. Also such a detectable indicium may, for example, comprise an electrically detectable indicium (e.g., a programmed bit in on-board non-volatile memory).

Also for example, step 170 may comprise designating the integrated circuit as meeting the performance requirements (or not) by entering data indicative of such designation in a database associated with the integrated circuit. Such a database may, for example, comprise a centralized production floor database or may, for example, comprise a relatively distributed database (e.g., a memory device associated with the integrated circuit or a set of integrated circuits during testing or production).

Further for example, step 170 may comprise designating the integrated circuit as meeting the performance requirements (or not) by ceasing testing activities and/or routing the integrated circuit along a particular test or production path. For example step 170 may comprise routing the integrated circuit along a production or testing path that is dedicated to integrated circuits that meet the performance requirements at non-nominal power supply characteristics.

The exemplary method may, at step 180, comprise performing continued processing of the integrated circuit, which was found to meet performance requirements at non-nominal power supply characteristics. Step 180 may, for example, comprise routing the integrated circuit to a production station that processes integrated circuits that meet performance requirements at non-nominal power supply characteristics.

Step 180 may, for example, comprise performing additional performance testing. In an exemplary scenario where the integrated circuit was found to not meet performance requirements at nominal power supply characteristics but meet performance requirements at non-nominal power supply characteristics, step 180 may comprise performing analysis on the integrated circuit to determine the cause of such testing results.

Step 180 may also, for example, comprise packaging the integrated circuit in a manner commensurate with integrated circuits that meet performance requirements at non-nominal power supply characteristics. In general, step 180 may comprise performing continued processing of the integrated circuit, which was found to meet performance requirements at non-nominal power supply characteristics. Accordingly, the scope of various aspects of the present invention should not be limited by characteristics of any particular continued processing.

It should be noted that the exemplary system 100 illustrated in FIG. 1 and discussed previously was presented to provide specific illustrations of a portion of generally broader aspects of the present invention. Accordingly, the scope of various aspects of the present invention should by no means be limited by characteristics of the exemplary system 100.

Figure 2:
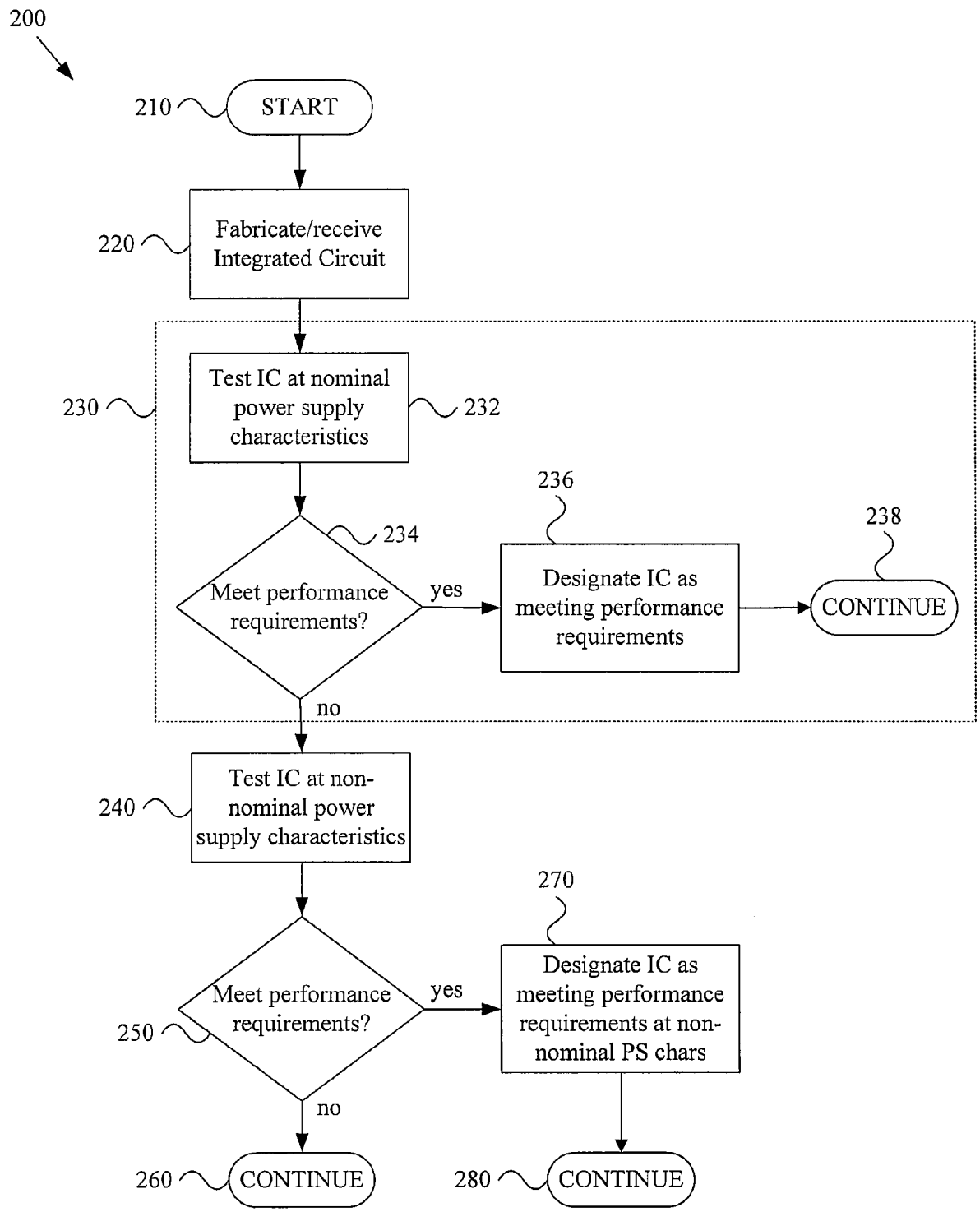
FIG. 2 illustrates an exemplary method for providing increased manufacturing yield for integrated circuits, in accordance with various aspects of the present invention.

FIG. 2 illustrates an exemplary method 200 for providing increased manufacturing yield for integrated circuits, in accordance with various aspects of the present invention. The exemplary method 200 may, for example and without limitation, share various characteristics with the exemplary method 100 illustrated in FIG. 1 and discussed previously.

The exemplary method 200 may, at step 220, comprise receiving an integrated circuit. Step 220 may, for example and without limitation, share various characteristics with step 120 of the exemplary method 100 illustrated in FIG. 1 and discussed previously.

The exemplary method may, at step 232, comprise testing the integrated circuit (e.g., as received at step 220) at nominal power supply characteristics to determine if the integrated circuit meets performance requirements at nominal power supply characteristics. Various aspects of nominal power supply characteristics and integrated circuit performance requirements were presented previously in the discussion of FIG. 1. Step 232 may, for example and without limitation, share various characteristics with step 140 of the exemplary method 100 illustrated in FIG. 1 and discussed previously, which was generally directed to testing the integrated circuit at non-nominal power supply characteristics.

For example, in an exemplary scenario where the nominal power supply characteristics comprise a nominal voltage range, step 232 may comprise testing the integrated circuit over the nominal voltage range (e.g., at a discrete number of voltages across the nominal voltage range). In another exemplary scenario where the nominal power supply characteristics comprise a nominal target voltage with a nominal tolerance range, step 232 may comprise testing the integrated circuit at the nominal target voltage and at various voltages across the nominal tolerance range (e.g., including voltage values at the limits of the nominal tolerance range).

In a further exemplary scenario where the nominal power supply characteristics comprise a minimum current supply level, step 232 may comprise testing the integrated circuit at the minimum current supply level and higher current supply levels. In yet another exemplary scenario where the nominal power supply characteristics comprise a maximum amount of electrical noise, step 232 may comprise testing the integrated circuit with the maximum amount of electrical noise.

In another exemplary scenario where the nominal power supply characteristics comprise a maximum duration of a temporary voltage drop, step 232 may comprise testing the integrated circuit with a voltage drop of the nominal maximum duration. In yet another exemplary scenario where the nominal power supply characteristics comprise a maximum duration of a temporary current supply drop, step 232 may comprise testing the integrated circuit with a current supply drop of the nominal maximum duration.

Step 232 may perform such integrated circuit testing in any of a variety of manners. For example and without limitation, step 232 may comprise testing performance of the integrated circuit in a test circuit. Also for example, step 232 may comprise testing performance of the integrated circuit as a stand-alone device. Step 232 may also, for example, comprise utilizing various commercially available testing apparatus or may comprise utilizing custom testing apparatus. Step 232 may, for example, comprise testing the integrated circuit on testing apparatus dedicated to such a test or may, for example, comprise testing the integrated circuit on testing apparatus that is also utilized for additional testing of the integrated circuit or for testing other circuits.

Step 232 may, for example, comprise applying electrical power having nominal power supply characteristics to the integrated circuit and monitoring any of a variety of performance indicators. For example, step 232 may process monitored performance indicators to determine whether the integrated circuit meets performance requirements when operated at nominal power supply characteristics.

In general, exemplary step 232 may comprise testing the integrated circuit at nominal power supply characteristics to determine if the integrated circuit meets performance requirements at nominal power supply characteristics. Accordingly, the scope of various aspects of the present invention should not be limited by aspects of particular nominal power supply characteristics or by characteristics of any particular manner of testing the integrated circuit at such nominal power supply characteristics.

The exemplary method 200 may, at step 234, comprise controlling execution flow of the exemplary method 200. Step 234 may, for example, analyze the results of the integrated circuit testing performed at step 232 and direct execution flow of the exemplary method 200 according to whether the exemplary circuit met performance requirements at nominal power supply characteristics. For example, if step 232 tested the integrated circuit at nominal power supply characteristics and found that the integrated circuit did not meet performance requirements at nominal power supply characteristics, then step 234 may direct execution flow to step 240 for further testing. Also for example, if step 232 tested the integrated circuit at nominal power supply characteristics and found that the integrated circuit met performance requirements at nominal power supply characteristics, then step 234 may direct execution flow to step 236 for further processing.

The exemplary method 200, at step 236, may comprise designating the integrated circuit as meeting the performance requirements (e.g., absolutely or at the nominal power supply characteristics). Step 236 may, for example and without limitation, share various characteristics with step 170 of the exemplary method 100 illustrated in FIG. 1 and discussed previously. Though exemplary step 170 generally comprised designating the integrated circuit as meeting the performance requirements at non-nominal power supply characteristics, various characteristics of step 170, by analogy, may apply to step 236.

For example, step 236 may comprise performing such designating in any of a variety of manners. For example and without limitation, step 236 may comprise designating the integrated circuit as meeting the performance requirements (or not) at nominal power supply characteristics by physically marking the integrated circuit with a detectable indicium indicative of the integrated circuit meeting the performance requirements at nominal power supply characteristics. Such a detectable indicium may, for example, comprise a visibly detectable indicium. Also such a detectable indicium may, for example, comprise an electrically detectable indicium (e.g., a programmed bit in on-board non-volatile memory).

Also for example, step 236 may comprise designating the integrated circuit as meeting the performance requirements (or not) by entering data indicative of such designation in a database associated with the integrated circuit. Such a database may, for example, comprise a centralized production floor database or may, for example, comprise a relatively distributed database (e.g., a memory device associated with the integrated circuit or a set of integrated circuits, for example a batch or pallet, during testing or production).

Further for example, step 236 may comprise designating the integrated circuit as meeting the performance requirements (or not) by ceasing testing activities and/or routing the integrated circuit along a particular test or production path. For example, step 236 may comprise routing the integrated circuit along a production or testing path that is dedicated to integrated circuits that meet the performance requirements at nominal power supply characteristics.

The exemplary method 200 may, at step 238, comprise performing continued processing of the integrated circuit, which was found to meet performance requirements at nominal power supply characteristics. Step 238 may, for example and without limitation, share various characteristics with step 180 of the exemplary method 100 illustrated in FIG. 1 and discussed previously. Though exemplary step 180 generally comprised performing continued processing on the integrated circuit as meeting the performance requirements at non-nominal power supply characteristics, various characteristics of step 180, by analogy, may apply to step 238.

Step 238 may, for example, comprise routing the integrated circuit to a manufacturing station that processes integrated circuits that meet performance requirements at nominal power supply characteristics. Step 238 may, for example, comprise performing additional performance testing, if desired. Step 238 may also, for example, comprise packaging the integrated circuit in a manner commensurate with integrated circuits that meet performance requirements at nominal power supply characteristics.

In general, step 238 may comprise performing continued processing of the integrated circuit, which was found to meet performance requirements at nominal power supply characteristics. Accordingly, the scope of various aspects of the present invention should not be limited by characteristics of any particular continued processing.

In the previous discussion of step 130 of the exemplary method 100 of FIG. 1, it was mentioned that step 130 may comprise optionally performing any of a variety of manufacturing activities on the integrated circuit, including for example, inventorying, inspecting, accounting, routing, packing, re-packing, transporting, testing, sampling, marking, mounting, etc. Exemplary steps 232-238 (enclosed by dashed box 230) provide a non-limiting example of such manufacturing activities, in the form of integrated circuit testing activity. The scope of various aspects of the present invention should not, however, be limited to the exemplary testing activity illustrated in step 230.

The exemplary method 200 may, for example, perform steps 240-280 in a scenario where steps 232-234 determined that the integrated circuit did not meet performance requirements at nominal power supply characteristics. Steps 240-280 may generally comprise testing the integrated circuit at non-nominal power supply characteristics to determine if the integrated circuit meets performance requirements at non-nominal power supply characteristics, and if the integrated circuit meets the performance requirements at the non-nominal power supply characteristics, then designating the integrated circuit as meeting the performance requirements at non-nominal power supply characteristics. Steps 240-280 may, for example and without limitation, share various characteristics with corresponding steps 140-180 of the exemplary method 100 illustrated in FIG. 1 and discussed previously.

It should be noted that the exemplary system 200 illustrated in FIG. 2 and discussed previously was presented to provide specific illustrations of a portion of generally broader aspects of the present invention. Accordingly, the scope of various aspects of the present invention should by no means be limited by characteristics of the exemplary system 200.

Figure 3:
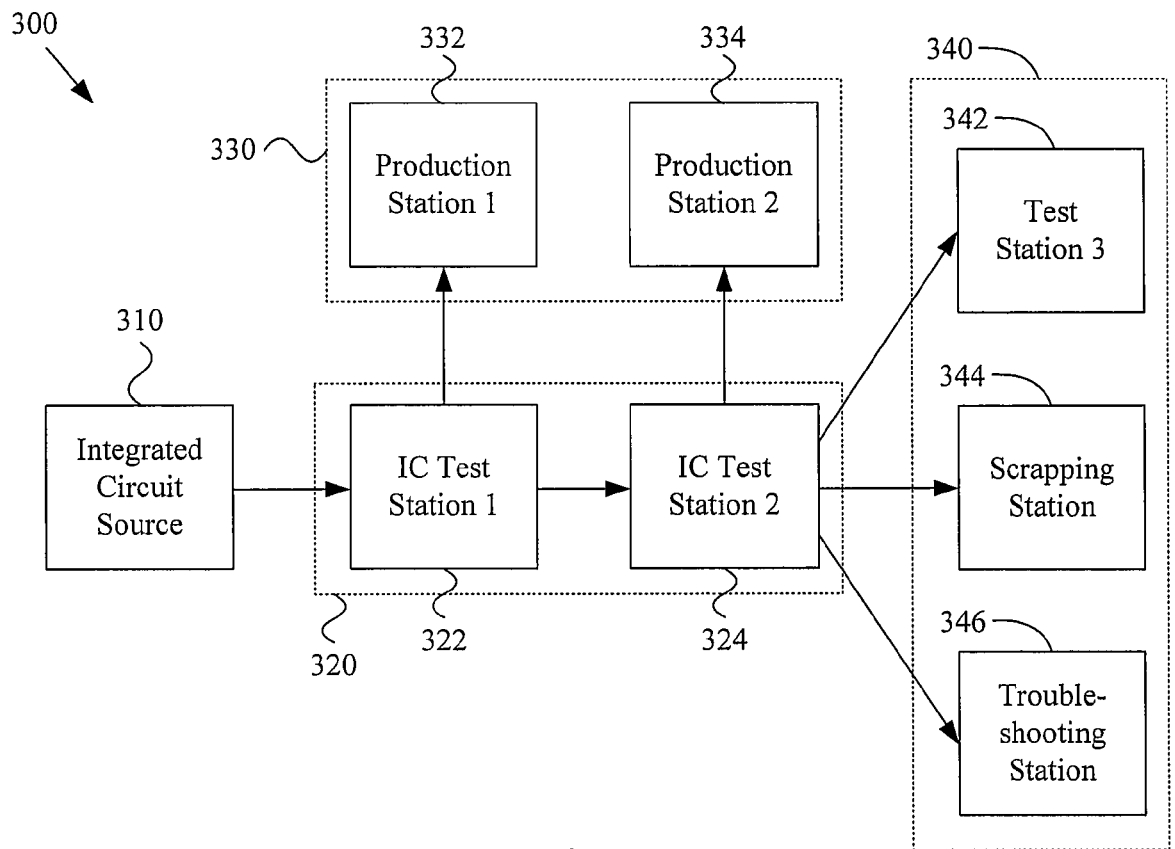
FIG. 3 illustrates an exemplary system for providing increased manufacturing yield for integrated circuits, in accordance with various aspects of the present invention.

FIG. 3 illustrates an exemplary system 300 for providing increased manufacturing yield for integrated circuits, in accordance with various aspects of the present invention. Various components of the system 300 may, for example and without limitation, share various functional characteristics with the exemplary methods 100, 200 illustrated in FIGS. 1-2 and discussed previously.

The exemplary system 300 may comprise an integrated circuit source 310. The exemplary system 300 may also comprise an integrated circuit test environment 320 that receives integrated circuits from the integrated circuit source 310. The exemplary system 300 may further comprise a downstream production environment for passing product 330 and a downstream production environment for failing product 340, each of which may receive tested integrated circuits from the integrated circuit test environment 320.

The integrated circuit source 310 may comprise characteristics of any of a variety of integrated circuit sources. For example and without limitation, the integrated circuit source 310 may comprise an upstream integrated circuit fabrication line. Such a fabrication line may, for example, be co-located with the integrated circuit test environment 320 or may be geographically separated from the integrated circuit test environment 320. The integrated circuit source 310 may also, for example, comprise an integrated circuit receiving station where integrated circuits may arrive at the system 300 through any of a number of delivery methods. Such delivery methods may, for example, comprise a conveyor, transportation cart, transportation truck, etc. In general, the integrated circuit source 310 may comprise characteristics of any of a variety of integrated circuit sources. Accordingly, the scope of various aspects of the present invention should not be limited by characteristics of a particular integrated circuit source.

The integrated circuit test environment 320 may receive an integrated circuit from the integrated circuit source 310. The integrated circuit test environment 320 may, for example and without limitation, share various functional characteristics with the exemplary methods 100, 200 (e.g., steps 120-170 and 220-270) illustrated in FIGS. 1-2 and discussed previously.

The integrated circuit test environment 320 may comprise characteristics of any of a variety of test environment configurations. In the exemplary configuration illustrated in FIG. 3, the integrated circuit test environment 320 may comprise a first integrated circuit test station 322 and a second integrated circuit test station 324. However, the scope of various aspects of the present invention should not be limited by characteristics of such an exemplary test environment configuration.

The integrated circuit test environment 320 may comprise a first integrated circuit test station 322. The first integrated circuit test station 322 may, for example and without limitation, share various functional characteristics with the exemplary methods 100, 200 (e.g., steps 220 and 232-236) illustrated in FIGS. 1-2 and discussed previously.

The first IC test station 322 may, for example, receive an integrated circuit (e.g., from the IC source 310 or an alternative source). The first IC test station 322 may, for example and without limitation, receive the integrated circuit in a batch or in series on a conveyor. The first IC test station 322 may, for example, receive the integrated circuit automatically or manually. The scope of various aspects of the present invention should not be limited by characteristics of a specific manner of receiving an integrated circuit or of a device that receives an integrated circuit.

The first IC test station 322 may, for example, test the integrated circuit at nominal power supply characteristics to determine if the integrated circuit meets performance requirements at nominal power supply characteristics. Various aspects of nominal power supply characteristics and integrated circuit performance requirements were discussed previously in the discussion of FIG. 1.

For example, in an exemplary scenario where the nominal power supply characteristics comprise a nominal voltage range, the first IC test station 322 may test the integrated circuit over the nominal voltage range (e.g., at a discrete number of voltages across the nominal voltage range). In another exemplary scenario where the nominal power supply characteristics comprise a nominal target voltage with a nominal tolerance range, the first IC test station 322 may test the integrated circuit at the nominal target voltage and/or at various voltages across the nominal tolerance range (e.g., including voltage values at the limits of the nominal tolerance range).

In a further exemplary scenario where the nominal power supply characteristics comprise a minimum current supply level, the first IC test station 322 may test the integrated circuit at the minimum current supply level and higher current supply levels. In yet another exemplary scenario where the nominal power supply characteristics comprise a maximum amount of electrical noise, the first IC test station 322 may test the integrated circuit with the maximum amount of electrical noise.

In another exemplary scenario where the nominal power supply characteristics comprise a maximum duration of a temporary voltage drop, the first IC test station 322 may test the integrated circuit with a voltage drop of the nominal maximum duration. In yet another exemplary scenario where the nominal power supply characteristics comprise a maximum duration of a temporary current supply drop, the first IC test station 322 may test the integrated circuit with a current supply drop of the nominal maximum duration.

The first IC test station 322 may perform such integrated circuit testing in any of a variety of manners. For example and without limitation, the first IC test station 322 may test performance of the integrated circuit in a test circuit. Also for example, the first IC test station 322 may test performance of the integrated circuit as a stand-alone device. The first IC test station 322 may, for example, utilize various commercially available testing apparatus or may utilize custom testing apparatus. The first IC test station 322 may, for example, test the integrated circuit on testing apparatus dedicated to such a test or may, for example, test the integrated circuit on testing apparatus that is also utilized for additional testing of the integrated circuit or testing other circuits.

The first IC test station 322 may, for example, apply electrical power having nominal power supply characteristics to the integrated circuit and monitor any of a variety of performance indicators. For example, the first IC test station 322 may process monitored performance indicators to determine whether the integrated circuit meets performance requirements when operated at nominal power supply characteristics.

In general, the first IC test station 322 may test the integrated circuit at nominal power supply characteristics to determine if the integrated circuit meets performance requirements at nominal power supply characteristics. Accordingly, the scope of various aspects of the present invention should not be limited by aspects of particular nominal power supply characteristics or by characteristics of any particular manner of testing the integrated circuit or of any device that may test the integrated circuit at such nominal power supply characteristics.

The first IC test station 322 may, for example, control product flow of the integrated circuit. The first IC test station 322 may, for example, analyze the results of the integrated circuit testing and direct product flow of the integrated circuit according to whether the exemplary integrated circuit met performance requirements at nominal power supply characteristics. For example, if the first IC test station 322 tested the integrated circuit at nominal power supply characteristics and found that the integrated circuit did not meet performance requirements at nominal power supply characteristics, then the first IC test station 322 may direct product flow of the integrated circuit to the second test station 324 for further testing. Also for example, if the first IC test station 322 tested the integrated circuit at nominal power supply characteristics and found that the integrated circuit met performance requirements at nominal power supply characteristics, then the first IC test station 322 may direct product flow of the integrated circuit to the downstream production environment for passing product 330 (e.g., to the first production station 332) for further processing.

In an exemplary scenario where the first IC test station 322 determined that the integrated circuit met performance requirements at nominal power supply characteristics, the first IC test station 322 (including, e.g., another related station) may designate the integrated circuit as meeting the performance requirements (e.g., absolutely or at nominal power supply characteristics). For example, the first IC test station 322 may perform such designating in any of a variety of manners. For example and without limitation, the first IC test station 322 (which may, e.g., include a separate downstream production station) may designate the integrated circuit as meeting the performance requirements (or not) at nominal power supply characteristics by physically marking the integrated circuit with a detectable indicium indicative of the integrated circuit meeting the performance requirements at nominal power supply characteristics. Such a detectable indicium may, for example, comprise a visibly detectable indicium. Also such a detectable indicium may, for example, comprise an electrically detectable indicium (e.g., a programmed bit in on-board non-volatile memory).

Also for example, the first IC test station 322 may designate the integrated circuit as meeting the performance requirements (or not) by entering data indicative of such designation in a database associated with the integrated circuit. Such a database may, for example, comprise a centralized production floor database or may, for example, comprise a relatively distributed database (e.g., a memory device associated with the integrated circuit or a set of integrated circuits, for example a batch or pallet, during testing or production).

Further for example, the first IC test station 322 may designate the integrated circuit as meeting the performance requirements (or not) by ceasing testing activities and/or routing the integrated circuit along a particular test or production path. For example, the first IC test station 322 may route the integrated circuit along a production or testing path that is dedicated to integrated circuits that meet the performance requirements at nominal power supply characteristics. In the exemplary system 300 illustrated in FIG. 3, such a production path may, for example, lead from the first IC test station 322 to the first production station 332.

As mentioned previously, if the first IC test station 322 tested the integrated circuit at nominal power supply characteristics and found that the integrated circuit met performance requirements at the nominal power supply characteristics, then the first IC test station 322 may direct product flow of the integrated circuit to the downstream production environment for passing product 330 (e.g., to the first production station 332) for further processing. The exemplary first production station 332 may, for example, perform any of a variety of processing (including material-handling) tasks related to an integrated circuit that is found to meet performance requirements at nominal power supply characteristics. For example and without limitation, the first production station 332 may share various functional characteristics with step 238 of the exemplary method 200 illustrated in FIG. 2 and discussed previously.

The first production station 332 may, for example, perform additional performance testing, if desired. The first production station 332 may also, for example, package the integrated circuit in a manner commensurate with integrated circuits that meet performance requirements at nominal power supply characteristics. In general, the first production station 332 may perform continued processing of the integrated circuit, which was found to meet performance requirements at nominal power supply characteristics. Accordingly, the scope of various aspects of the present invention should not be limited by characteristics of any particular continued processing or of devices for performing particular continued processing.

The integrated circuit test environment 320 may comprise a second integrated circuit test station 324. The second integrated circuit test station 324 may, for example and without limitation, share various functional characteristics with the exemplary methods 100, 200 (e.g., steps 140-170 and 240-270) illustrated in FIGS. 1-2 and discussed previously.

The second IC test station 324 may, for example, receive an integrated circuit (e.g., from the first IC test station 322 or an alternative source). The second IC test station 324 may, for example and without limitation, receive the integrated circuit in a batch or in series on a conveyor. The second IC test station 324 may, for example, receive the integrated circuit automatically or manually. The scope of various aspects of the present invention should not be limited by characteristics of a specific manner of receiving an integrated circuit or of a device that receives an integrated circuit.

The second IC test station 324 may, for example, test the integrated circuit at non-nominal power supply characteristics to determine if the integrated circuit meets performance requirements at non-nominal power supply characteristics. Various aspects of non-nominal power supply characteristics and integrated circuit performance requirements were discussed previously in the discussion of FIG. 1.

For example, in an exemplary scenario where the nominal power supply characteristics comprise a nominal voltage range, the second IC test station 324 may test the integrated circuit at a non-nominal voltage outside of the nominal voltage range. In another exemplary scenario where the nominal power supply characteristics comprise a nominal target voltage with a nominal tolerance range, the second IC test station 324 may test the integrated circuit over a non-nominal tolerance range that is smaller than the nominal tolerance range.

In a further exemplary scenario where the nominal power supply characteristics comprise a minimum current supply level, the second IC test station 324 may test the integrated circuit at a non-nominal current supply level that is less than the nominal minimum current supply level. In yet another exemplary scenario where the nominal power supply characteristics comprise a maximum amount of electrical noise, the second IC test station 324 may test the integrated circuit with a non-nominal maximum amount of electrical noise that is less than the nominal maximum amount of electrical noise.

In another exemplary scenario where the nominal power supply characteristics comprise a maximum duration of a temporary voltage drop, the second IC test station 324 may test the integrated circuit with a non-nominal maximum voltage drop duration that is less than the nominal maximum duration. In yet another exemplary scenario where the nominal power supply characteristics comprise a maximum duration of a temporary current supply drop, the second IC test station 324 may test the integrated circuit with a non-nominal maximum current supply drop duration that is less than the nominal maximum duration.

The second IC test station 324 may perform such integrated circuit testing in any of a variety of manners. For example and without limitation, the second IC test station 324 may test performance of the integrated circuit in a test circuit. Also for example, the second IC test station 324 may test performance of the integrated circuit as a stand-alone device. The second IC test station 324 may comprise utilizing various commercially available testing apparatus or may comprise utilizing custom testing apparatus. The second IC test station 324 may, for example, test the integrated circuit on testing apparatus dedicated to such a test or may, for example, test the integrated circuit on testing apparatus that is also utilized for other testing of the integrated circuit or other circuits.

The second IC test station 324 may, for example, apply electrical power having non-nominal power supply characteristics to the integrated circuit and monitor any of a variety of performance indicators. The second IC test station 324 may, for example, process monitored performance indicators to determine whether the integrated circuit meets performance requirements when operated at non-nominal power supply characteristics.

In general, the exemplary second IC test station 324 may test the integrated circuit at non-nominal power supply characteristics to determine if the integrated circuit meets performance requirements at non-nominal power supply characteristics. Accordingly, the scope of various aspects of the present invention should not be limited by aspects of particular non-nominal power supply characteristics or by characteristics of any particular manner of testing the integrated circuit or of any particular device for testing the integrated circuit at such non-nominal power supply characteristics.

The second IC test station 324 may, for example, control product flow of the integrated circuit. The second IC test station 324 may, for example, analyze the results of the integrated circuit testing and direct product flow of the integrated circuit according to whether the exemplary circuit met performance requirements at non-nominal power supply characteristics. For example, if the second IC test station 324 tested the integrated circuit at non-nominal power supply characteristics and found that the integrated circuit did not meet performance requirements at non-nominal power supply characteristics, then the second IC test station 324 may direct product flow to the downstream production environment for failing product 340. Also for example, if the second IC test station 324 tested the integrated circuit at non-nominal power supply characteristics and found that the integrated circuit met performance requirements at non-nominal power supply characteristics, then the second IC test station 324 may direct product flow of the integrated circuit to the downstream production environment for passing product 330 (e.g., to the second production station 334) for further processing.

In an exemplary scenario where the second IC test station 324 determined that the integrated circuit met performance requirements at non-nominal power supply characteristics, the second IC test station 324 (including, e.g., another related station), may designate the integrated circuit as meeting the performance requirements at non-nominal power supply characteristics. The second IC test station 324 may perform such designating in any of a variety of manners. For example and without limitation, the second IC test station 324 (which may, e.g., include a separate downstream production station) may designate the integrated circuit as meeting the performance requirements (or not) at non-nominal power supply characteristics by physically marking the integrated circuit with a detectable indicium indicative of the integrated circuit meeting the performance requirements at non-nominal power supply characteristics. Such a detectable indicium may, for example, comprise a visibly detectable indicium. Also such a detectable indicium may, for example, comprise an electrically detectable indicium (e.g., a programmed bit in on-board non-volatile memory).

Also for example, the second IC test station 324 may designate the integrated circuit as meeting the performance requirements (or not) by entering data indicative of such designation in a database associated with the integrated circuit. Such a database may, for example, comprise a centralized production floor database or may, for example, comprise a relatively distributed database (e.g., a memory device associated with the integrated circuit or a set of integrated circuits, for example a batch or pallet, during testing or production).

Further for example, the second IC test station 324 may designate the integrated circuit as meeting the performance requirements (or not) by ceasing testing activities and/or routing the integrated circuit along a particular test or production path. For example, the second IC test station 324 may route the integrated circuit along a production or testing path that is dedicated to integrated circuits that meet the performance requirements at non-nominal power supply characteristics. In the exemplary system 300 illustrated in FIG. 3, such a production path may, for example, lead from the second IC test station 324 to the second production station 334.

As mentioned previously, if the second IC test station 324 tested the integrated circuit at non-nominal power supply characteristics and found that the integrated circuit met performance requirements at the non-nominal power supply characteristics, then the second IC test station 324 may direct product flow of the integrated circuit to the downstream production environment for passing product 330 (e.g., to the second production station 334) for further processing. The exemplary second production station 334 may, for example, perform any of a variety of processing (including material-handling) tasks related to an integrated circuit that is found to meet performance requirements at non-nominal power supply characteristics. For example and without limitation, the second production station 334 may share various functional characteristics with steps 180 and 280 of the exemplary methods 100, 200 illustrated in FIGS. 1-2 and discussed previously.

The second production station 334 may, for example, perform additional performance testing, if desired. The second production station 334 may also, for example, package the integrated circuit in a manner commensurate with integrated circuits that meet performance requirements at non-nominal power supply characteristics. In general, the second production station 334 may perform continued processing of the integrated circuit, which was found to meet performance requirements at nominal power supply characteristics. Accordingly, the scope of various aspects of the present invention should not be limited by characteristics of any particular continued processing or of devices for performing particular continued processing.

As mentioned previously, if the second IC test station 324 tested the integrated circuit at non-nominal power supply characteristics and found that the integrated circuit did not meet performance requirements at the non-nominal power supply characteristics, then the second IC test station 324 may direct product flow of the integrated circuit to the downstream production environment for failing product 340. The downstream production environment for failing product 340 may, for example and without limitation, share various functional characteristics with steps 160 and 260 of the exemplary methods 100, 200 illustrated in FIGS. 1-2 and discussed previously.

For example, the downstream production environment for failing product 340 may comprise a third test station 342 that performs additional testing on the integrated circuit to further assess the integrated circuit's operational capabilities. Such further testing may also, for example, comprise testing the integrated circuit to less stringent performance requirements than previous tests (e.g., to determine if the integrated circuit is of any useful functional value). Also for example, the downstream production environment for failing product 340 may comprise a scrapping station 344 that manages various aspects related to scrapping the integrated circuit (e.g., accounting, accumulating processing control data, labeling, recycling, etc.).

Further for example, the downstream production environment for failing product 340 may comprise a troubleshooting station 346 that may be utilized to perform failure analysis on the integrated circuit. In general, the downstream production environment for failing product 340 may comprise any of a variety of processing stations related to the processing or handling of a failed integrated circuit. Accordingly, the scope of various aspects of the present invention should not be limited by characteristics of any particular manner of processing or handling failed integrated circuits or devices for performing such processing or handling.

It must be noted that the exemplary system 300 illustrated in FIG. 3 was presented and discussed to provide specific examples of a portion of generally broader aspects of the present invention. Accordingly, the scope of various aspects of the present invention should not be limited by specific characteristics of the exemplary system 300.

Figure 4:
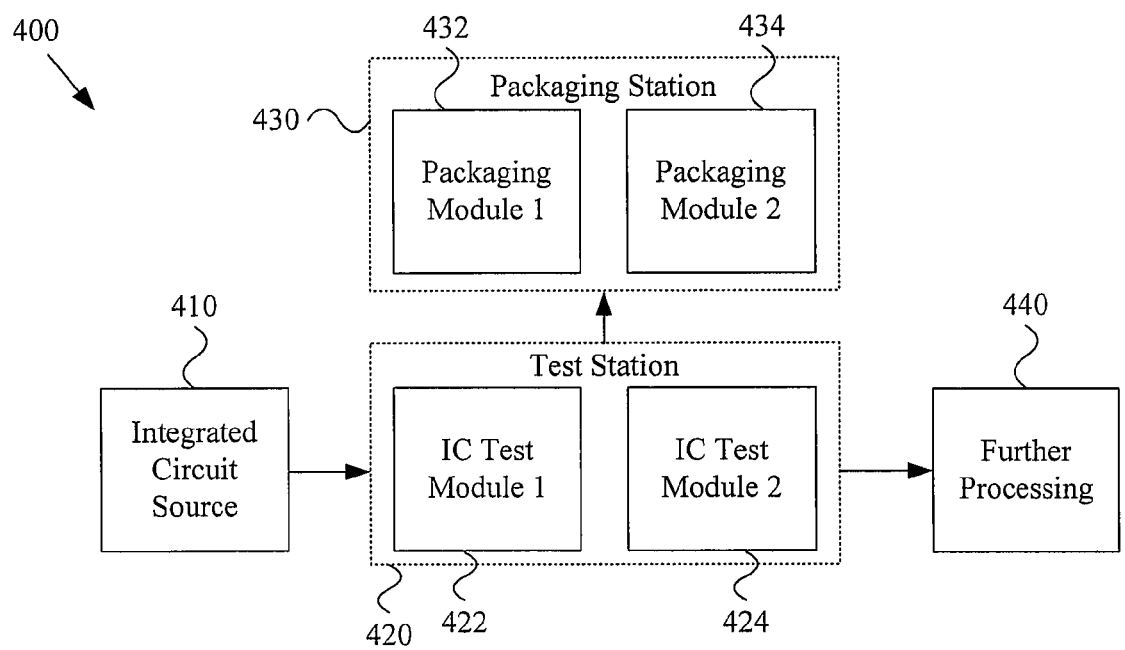
FIG. 4 illustrates an exemplary system for providing increased manufacturing yield for integrated circuits, in accordance with various aspects of the present invention.

FIG. 4 illustrates an exemplary system 400 for providing increased manufacturing yield for integrated circuits, in accordance with various aspects of the present invention. Various components of the exemplary system 400 may, for example and without limitation, share various functional characteristics with the exemplary methods 100, 200 illustrated in FIGS. 1-2 and discussed previously and with various aspects of the exemplary system 300 illustrated in FIG. 3 and discussed previously.

The exemplary system 400 may comprise an integrated circuit test environment that comprises a single integrated circuit test station 420. The integrated circuit test station 420 may, by analogy, share various characteristics with the test stations 322, 324 of the exemplary system 300 illustrated in FIG. 3 (e.g., individually or in combination).

For example, the integrated circuit test station 420 may comprise a first integrated circuit test module 422 and a second integrated circuit test module 424. A test module may, for example, comprise various combinations of hardware and/or software. The first IC test module 422 may, for example, be completely independent of the second IC test module 424 or may, for example, share various hardware and/or software components. For example and without limitation, the first IC test module 422 may share all hardware with the second IC test module 424. Accordingly, the scope of various aspects of the present invention should not be limited by arbitrary boundaries between hardware or software modules.

The first IC test module 422 and the second IC test module 424 may generally, for example and without limitation, share various characteristics with the first IC test station 322 and second IC test station 324 of the exemplary system 300 illustrated in FIG. 3, respectively.

The exemplary system 400 may comprise a downstream production environment for passing product that comprises a packaging station 430. The packaging station 430 may, by analogy, share various characteristics with the production stations 332, 334 of the exemplary system 300 illustrated in FIG. 3 and discussed previously.

For example, the packaging station 430 may comprise a first packaging module 432 and second packaging module 434. The first packaging module 432 may, for example, package integrated circuits in a manner commensurate with integrated circuits that meet performance requirements at nominal power supply characteristics. The second packaging module 434 may, for example, package integrated circuits in a manner commensurate with integrated circuits that meet performance requirements at non-nominal power supply characteristics.

The exemplary system 400 may comprise a downstream production environment for failing product 440. Such an environment 440 may, for example and without limitation, share various characteristics with the downstream production environment for failing product 340 of the exemplary system 300 illustrated in FIG. 3 and discussed previously.

It must be noted that the exemplary system 400 illustrated in FIG. 4 was presented and discussed to provide specific examples of a portion of generally broader aspects of the present invention. Accordingly, the scope of various aspects of the present invention should not be limited by specific characteristics of the exemplary system 400.

It should further be noted that the methods and systems illustrated in FIGS. 1-4 and discussed previously are merely exemplary, and accordingly, the scope of various aspects of the present invention should not be limited by characteristics of the exemplary methods and systems. It should also be noted that various aspects of the present invention may be performed by any of a large variety of production (including, e.g., fabrication, testing and material handling) apparatus. Various aspects of the present invention may be performed manually, by automated processes, by hardware, by a processor executing software instructions, or any combination thereof.

Additionally, various system components, subsystems and/or modules discussed previously may be implemented in various degrees of production system integration. For example and without limitation, various components and/or modules may be implemented in a distributed system comprising geographically discrete subsystems or on a single local system. Likewise, various sub-components and/or sub-modules may be implemented on a single integrated circuit or a plurality of integrated circuits. Accordingly, the scope of various aspects of the present invention should not be limited by characteristics of any particular implementation.

In summary, various aspects of the present invention provide a system and method for providing increased manufacturing yield for integrated circuits. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A method for providing increased manufacturing yield for integrated circuits, the method comprising:
   receiving an integrated circuit designed to meet performance requirements when provided with electrical current characterized by nominal electrical current characteristics;
   testing the integrated circuit by, at least in part, providing the integrated circuit with electrical current characterized by non-nominal electrical current characteristics, different from the nominal electrical current characteristics, to determine if the integrated circuit meets the performance requirements when provided with electrical current characterized by non-nominal electrical current characteristics; and
   if the integrated circuit meets the performance requirements when provided with electrical current characterized by non-nominal electrical current characteristics, then designating the integrated circuit as meeting the performance requirements when provided with electrical current characterized by non-nominal electrical current characteristics.

2. The method of claim 1, further comprising:
   testing the integrated circuit by, at least in part, providing the integrated circuit with electrical current characterized by nominal electrical current characteristics to determine if the integrated circuit meets the performance requirements when provided with electrical current characterized by nominal electrical current characteristics; and
   if the integrated circuit meets the performance requirements when provided with electrical current characterized by nominal current characteristics, then designating the integrated circuit as meeting the performance requirements.

3. The method of claim 2, further comprising only testing the integrated circuit by, at least in part, providing the integrated circuit with electrical current characterized by non-nominal electrical current characteristics if the integrated circuit does not meet the performance requirements when provided with electrical current characterized by nominal electrical current characteristics.

4. The method of claim 1, wherein the integrated circuit comprises circuitry adapted to communicate electrical current information with a variable power supply circuit.

5. The method of claim 1, wherein the nominal electrical current characteristics comprise a nominal electrical current level, and the non-nominal electrical current characteristics comprise a non-nominal electrical current level different from the nominal electrical current level.

6. The method of claim 1, wherein the nominal electrical current characteristics comprise a nominal amount of electrical current variability, and the non-nominal electrical current characteristics comprise a non-nominal amount of electrical current variability different from the nominal amount of electrical current variability.

7. The method of claim 1, wherein the nominal electrical current characteristics comprise a nominal electrical current tolerance limit, and the non-nominal electrical current characteristics comprise a non-nominal electrical current tolerance limit different from the nominal electrical current tolerance limit.

8. The method of claim 1, wherein the nominal electrical current characteristics comprise nominal electrical current spike or surge characteristics, and the non-nominal electrical current characteristics comprise non-nominal electrical current spike or surge characteristics different from the nominal electrical current spike or surge characteristics.

9. The method of claim 1, wherein the nominal electrical current characteristics comprise a nominal electrical current load response, and the non-nominal electrical current characteristics comprise a non-nominal electrical current load response different from the nominal electrical current load response.

10. The method of claim 1, wherein the nominal electrical current characteristics comprise a nominal minimum electrical current supply level, and the non-nominal electrical current characteristics comprise a non-nominal minimum electrical current supply level different from the nominal minimum electrical current supply level.

11. The method of claim 1, wherein the nominal electrical current characteristics comprise a nominal maximum duration of a current supply drop, and the non-nominal electrical current characteristics comprise a non-nominal maximum duration of a current supply drop different from the nominal maximum duration of a current supply drop.

12. The method of claim 1, wherein the performance requirements comprise integrated circuit processing speed.

13. The method of claim 2, further comprising:
if the integrated circuit meets performance requirements when provided with electrical current characterized by nominal electrical current characteristics, then routing the integrated circuit to a first production station; and
if the integrated circuit meets performance requirements when provided with electrical current characterized by non-nominal electrical current characteristics, then routing the integrated circuit to a second production station.

14. The method of claim 1, wherein the non-nominal electrical current characteristics generally correspond to electrical current provided by known variable power supply circuitry.

15. The method of claim 2, wherein testing the integrated circuit at nominal power supply characteristics and testing the integrated circuit at non-nominal power supply characteristics are performed at a single test station.

16. The method of claim 1, further comprising:
if the integrated circuit meets performance requirements when provided with electrical current characterized by non-nominal electrical current characteristics, then routing the integrated circuit to a first production station; and
if the integrated circuit fails to meet performance requirements when provided with electrical current characterized by non-nominal electrical current characteristics, then routing the integrated circuit to a second production station.

17. The method of claim 1, wherein designating the integrated circuit as meeting the performance requirements when provided with electrical current characterized by non-nominal electrical current characteristics comprises marking the integrated circuit with a detectable indicium indicative of the integrated circuit meeting the performance requirements when provided with electrical current characterized by non-nominal electrical current characteristics.

18. The method of claim 17, wherein the detectable indicium comprises a visible indicium.

19. The method of claim 1, wherein designating the integrated circuit as meeting the performance requirements when provided with electrical current characterized by non-nominal electrical current characteristics comprises designating one or more particular power supply circuits for providing power to the integrated circuit.

20. A system for providing increased manufacturing yield for integrated circuits, the system comprising:
one or more integrated circuit test stations that operate to receive an integrated circuit designed to meet performance requirements when provided with electrical current characterized by nominal electrical current characteristics,
wherein the one or more integrated circuit test stations further operate to test the integrated circuit by, at least in part, providing the integrated circuit with electrical current characterized by non-nominal electrical current characteristics, different from the nominal electrical current characteristics, to determine if the integrated circuit meets the performance requirements when provided with electrical current characterized by non-nominal electrical current characteristics, and
wherein the one or more integrated circuit test stations further operate to, if the integrated circuit meets the performance requirements when provided with electrical current characterized by non-nominal electrical current characteristics, then designate the integrated circuit as meeting the performance requirements when provided with electrical current characterized by non-nominal electrical current characteristics.

21. The system of claim 20, wherein the one or more integrated circuit test stations further operate to:
test the integrated circuit by, at least in part, providing the integrated circuit with electrical current characterized by nominal electrical current characteristics to determine if the integrated circuit meets the performance requirements when provided with electrical current characterized by nominal electrical current characteristics; and
if the integrated circuit meets the performance requirements when provided with electrical current characterized by nominal current characteristics, then designate the integrated circuit as meeting the performance requirements.

22. The system of claim 21, wherein the one or more integrated circuit test stations further operate to only test the integrated circuit by, at least in part, providing the integrated circuit with electrical current characterized by non-nominal electrical current characteristics if the integrated circuit does not meet the performance requirements when provided with electrical current characterized by nominal electrical current characteristics.

23. The system of claim 20, wherein the integrated circuit comprises circuitry adapted to communicate electrical current information with a variable power supply circuit.

24. The system of claim 20, wherein the nominal electrical current characteristics comprise a nominal electrical current level, and the non-nominal electrical current characteristics comprise a non-nominal electrical current level different from the nominal electrical current level.

25. The system of claim 20, wherein the nominal electrical current characteristics comprise a nominal amount of electrical current variability, and the non-nominal electrical current characteristics comprise a non-nominal amount of electrical current variability different from the nominal amount of electrical current variability.

26. The system of claim 20, wherein the nominal electrical current characteristics comprise a nominal electrical current tolerance limit, and the non-nominal electrical current characteristics comprise a non-nominal electrical current tolerance limit different from the nominal electrical current tolerance limit.

27. The system of claim 20, wherein the nominal electrical current characteristics comprise nominal electrical current spike or surge characteristics, and the non-nominal electrical current characteristics comprise non-nominal electrical current spike or surge characteristics different from the nominal electrical current spike or surge characteristics.

28. The system of claim 20, wherein the nominal electrical current characteristics comprise a nominal electrical current load response, and the non-nominal electrical current characteristics comprise a non-nominal electrical current load response different from the nominal electrical current load response.

29. The system of claim 20, wherein the nominal electrical current characteristics comprise a nominal minimum electrical current supply level, and the non-nominal electrical current characteristics comprise a non-nominal minimum electrical current supply level different from the nominal minimum electrical current supply level.

30. The system of claim 20, wherein the nominal electrical current characteristics comprise a nominal maximum duration of a current supply drop, and the non-nominal electrical current characteristics comprise a non-nominal maximum duration of a current supply drop different from the nominal maximum duration of a current supply drop.

31. The system of claim 20, wherein the performance requirements comprise integrated circuit processing speed.

32. The system of claim 21, wherein the one or more integrated circuit test stations further operate to:
   if the integrated circuit meets performance requirements when provided with electrical current characterized by nominal electrical current characteristics, then route the integrated circuit to a first production station; and
   if the integrated circuit meets performance requirements when provided with electrical current characterized by non-nominal electrical current characteristics, then route the integrated circuit to a second production station.

33. The system of claim 20, wherein the non-nominal electrical current characteristics generally correspond to electrical current provided by known variable power supply circuitry.

34. The system of claim 21, wherein the one or more integrated circuit test stations operate to test the integrated circuit by, at least in part, providing the integrated circuit with electrical current characterized by nominal electrical current characteristics and providing the integrated circuit with electrical current characterized by non-nominal electrical current characteristics at a single integrated circuit test station.

35. The system of claim 20, wherein the one or more integrated circuit test stations further operate to:
   if the integrated circuit meets performance requirements when provided with electrical current characterized by non-nominal electrical current characteristics, then route the integrated circuit to a first production station; and
   if the integrated circuit fails to meet performance requirements when provided with electrical current characterized by non-nominal electrical current characteristics, then route the integrated circuit to a second production station.

36. The system of claim 20, wherein the one or more integrated circuit test stations operate to designate the integrated circuit as meeting the performance requirements when provided with electrical current characterized by non-nominal electrical current characteristics by, at least in part, marking the integrated circuit with a detectable indicium indicative of the integrated circuit meeting the performance requirements when provided with electrical current characterized by non-nominal electrical current characteristics.

37. The system of claim 36, wherein the detectable indicium comprises a visible indicium.

38. The system of claim 20, wherein the one or more integrated circuit test stations operate to designate the integrated circuit as meeting the performance requirements when provided with electrical current characterized by non-nominal electrical current characteristics by, at least in part, designating one or more particular power supply circuits for providing power to the integrated circuit.

* * * * *